United States Patent [19]
Odaira et al.

[11] Patent Number: 5,822,850
[45] Date of Patent: Oct. 20, 1998

[54] CIRCUIT DEVICES AND FABRICATION METHOD OF THE SAME

[75] Inventors: Hiroshi Odaira, Chigasaki; Eiji Imamura, Yokosuka; Yusuke Wada, Tokyo; Yasushi Arai, Fujisawa; Kenji Sasaoka, Zama; Takahiro Mori, Yokohama; Fumitoshi Ikegaya, Zama; Sadao Kowatari, Yokohama, all of Japan

[73] Assignee: Kabushiki Kaisha Toshiba, Kawasaki, Japan

[21] Appl. No.: 577,324

[22] Filed: Dec. 22, 1995

Related U.S. Application Data

[62] Division of Ser. No. 204,994, Mar. 2, 1994, Pat. No. 5,600,103.

[30] Foreign Application Priority Data

| Apr. 16, 1993 | [JP] | Japan | 5-090177 |
| Jun. 2, 1993 | [JP] | Japan | 5-131726 |
| Jun. 23, 1993 | [JP] | Japan | 5-152006 |
| Sep. 8, 1993 | [JP] | Japan | 5-223329 |

[51] Int. Cl.$^6$ .................................................. H05K 3/02
[52] U.S. Cl. ................... 29/846; 216/13; 216/17; 216/20; 216/36; 216/52; 29/848
[58] Field of Search .......................... 216/17, 18, 20, 216/33, 36, 52, 11, 13; 29/842, 846, 847, 848; 428/901; 361/774, 778, 792

[56] References Cited

U.S. PATENT DOCUMENTS

| 3,488,429 | 1/1970 | Boucher | 174/685 |
| 3,524,960 | 8/1970 | Lohff | 200/155 |
| 3,835,531 | 9/1974 | Luttmer | 29/625 |
| 4,584,767 | 4/1986 | Gregory | 29/848 |
| 4,606,787 | 8/1986 | Pelligrino | 156/632.1 |
| 4,825,539 | 5/1989 | Nagashima et al. | 29/830 |
| 4,991,285 | 2/1991 | Shaheen et al. | 29/830 |
| 5,057,969 | 10/1991 | Ameen et al. | 361/774 |
| 5,146,674 | 9/1992 | Frankeny et al. | 29/830 |
| 5,219,639 | 6/1993 | Sugawara et al. | 428/209 |
| 5,307,561 | 5/1994 | Feigenbaum et al. | 29/846 |
| 5,426,850 | 6/1995 | Fukutomi et al. | 29/848 |
| 5,440,075 | 8/1995 | Kawakita et al. | 174/265 |
| 5,457,881 | 10/1995 | Schmidt | 29/830 |
| 5,843,741 | 1/1996 | Akram et al. | 29/846 |

FOREIGN PATENT DOCUMENTS

| 9102817 | 5/1991 | Germany . |
| 0 608 726 A1 | 1/1994 | Germany . |

*Primary Examiner*—R. Bruce Breneman
*Assistant Examiner*—Anita Alanko
*Attorney, Agent, or Firm*—Finnegan, Henderson, Farabow, Garrett & Dunner, L.L.P.

[57] ABSTRACT

A supporting member or first synthetic resin sheet with conductive bumps disposed at predetermined positions are superposed on a second synthetic resin sheet under the condition that the resin component of the second synthetic resin sheet is plastic deformed or the temperature thereof exceeds a glass transition temperature so that the conductive bumps are pierced into the second synthetic resin sheet. In other words, the conductive bumps are pierced vertically into the second synthetic resin sheet so as to form through-type conducive lead portions exposed to the first (supporting substrate) and second synthetic resin sheets. The through-type conductive lead portions are used to electrically connect electric devices and circuit and to connect wiring pattern layers. The conductive bumps can be precisely and densely formed and disposed by printing method or plating method. The conductive bumps can be pushed and pierced into the second synthetic resin sheet. Moreover, the conductive bumps can be properly electrically connected to an opposed conductive layer. Thus, the circuit component provides high reliability and contributes to high yield and fabrication efficiency.

23 Claims, 10 Drawing Sheets

FIG. 4A
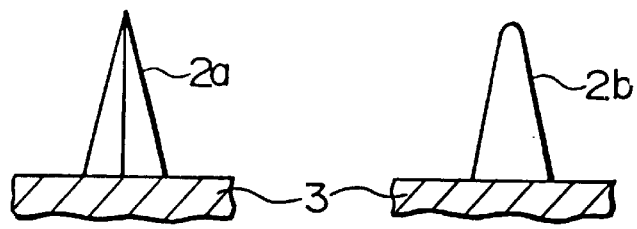
FIG. 4B
FIG. 4C
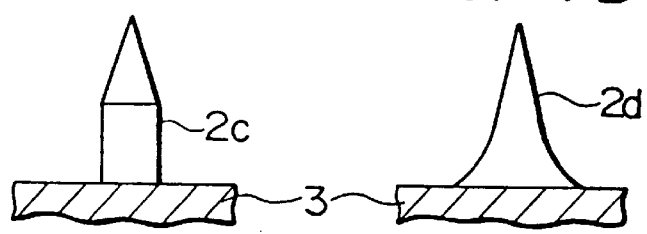
FIG. 4D
FIG. 5A
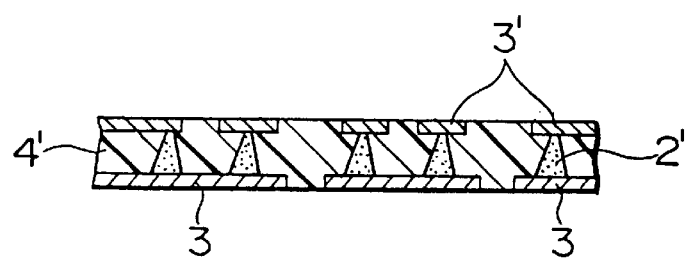
FIG. 5B
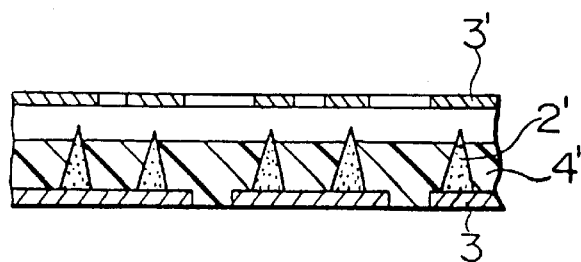

CIRCUIT DEVICES AND FABRICATION METHOD OF THE SAME

This is a division of application Ser. No. 08/204,994, filed Mar. 2, 1994, now U.S. Pat. No. 5,600,103

BACKGROUND OF THE INVENTION

1. Field of the Invention

The present invention relates to circuit devices such as inter-connectors that effectively connect electronic devices and form electronic circuits, and printed wiring boards that densely connect lines and components and a fabrication method thereof that can reduce the number of fabrication steps and contribute to improving the yield of fabrication.

2. Description of the Related Art

When electronic devices and a printed wiring board are connected or printed wiring boards are connected, they may be occasionally connected in the direction of thickness (namely, vertical direction or laminating direction) thereof. As connecting means in the vertical direction or laminating direction (namely, inter-connector technology), an anisotropic conductive adhesive agent is known. The anisotropic conductive adhesive agent is made by dispersing fine conductive particles in an adhesive sheet. When the anisotropic conductive adhesive agent sheet is pressed in the direction of thickness thereof with a predetermined force, the pressed region shows for only vertical direction conductivity. With the characteristics of the anisotropic conductive adhesive agent, for example glass cells of a liquid crystal device and a flexible wiring board are electrically connected. In reality, anisotropic conductive adhesive agent is placed between the glass cells of the liquid crystal device and the flexible wiring board. Then, the glass cells and the flexible wiring substrate are pressed together while heating, and they are adhered together. Conductive particles in the anisotropic conductive adhesive agent are electrically connected to the wiring pattern of the flexible wiring board and the glass cell through one particle or plural particles.

As means for electrically connecting electronic devices, lines are electrically connected to electronic devices disposed on the surface of a printed wiring board by using an anisotropic conductive adhesive agent. In this case, the electronic devices can be two-dimensionally connected over the printed wiring board.

In a printed wiring board, namely a double-sided printed wiring board or multi-layer printed wiring board, wiring layers such as double-sided conductive patterns are electrically connected in the following method. In the case of a double-sided printed wiring board, a double-sided copper clad substrate is drilled at predetermined positions. All the surfaces of the substrate including the inner hole walls are chemically plated and then electrically plated so as to form a conductive layer. The conductive layer is electrically plated so as to thicken the conductive layer. Thus, the reliability of the electrical connections of the wiring layers is completed.

In the case of a multi-layer printed wiring board, copper foils layered over both the surfaces of the board are patterned so as to fabricate a double-sided wiring board. Other copper foils are laminated on the double-sided wiring board through respective insulating sheets (or prepregs). By heating and pressuring, the copper foils are incorporated into the board. Similar when prepreg and described double sided circuit board these thing make one body with the double-sided printed wiring board, the board is drilled and plated so as to electrically connect the wiring layers each other. Further the outer copper foils are patterned. Thus, the fabrication of the four-layer printed wiring board is completed. A multi-layer printed wiring board with more wiring layers can be fabricated by increasing the number of double-sided printed wiring boards.

As a fabrication method of the printed wiring board, a method that electrically connects wiring layers each other without a plating process is known. In detail, a double-sided copper clad substrate is punched or drilled so as to form holes at predetermined positions. The punched or drilled holes are poured with conductive paste by for example printing method. A resin component of the conductive paste is hardened so as to electrically connect the wiring layers each other.

However, the circuit devices (such as above-mentioned inter-connectors, and printed wiring boards) and the fabrication method thereof have the following problems. When an anisotropic conductive adhesive agent is used in the inter-connector technology for connections in vertical direction or laminating direction, connecting resistance is generally high. Thus, the inter-connector technology is not suitable for connections in electric circuits that require low electric resistance. In other words, electric connections that use the above-mentioned anisotropic conductive adhesive agent are restricted.

On the other hand, in the case of the printed wiring board with wiring layers that are electrically connected by plating method and the fabrication method, walls of drilled holes that electrically connect wiring layers should be plated. Thus, the fabrication process of the printed wiring boards redundantly becomes long and the process management becomes complicated. In addition, when conducive paste is poured in holes that electrically connect wiring layers to each other by a printing method, the punching or drilling process is required as with the plating method. Moreover, it is difficult to equally pour the conductive paste in the punched or drilled holes. In addition, the reliability of the resultant electrical connections is low. Thus, the drilling process, plating process, and the like adversely affect the cost, yield, and so forth of the final printed wiring boards.

In the case of the printed wiring board with wiring layers that are electrically connected each other, holes for conductors which connect wiring layers each other are formed on both front and rear surfaces of the printed wiring board. Thus, circuit lines and electronic devices cannot be formed and disposed at the hole positions. In other words, the holes adversely affect the improvement of mounting density of electronic devices and lines. That is, the printed wiring boards fabricated by the conventional method are not suitable for high density of lines and circuit devices. Thus, practical printed wiring boards and a fabrication method thereof that satisfy high density of lines and circuit devices with low cost are needed.

SUMMARY OF THE INVENTION

A first object of the present invention is to provide a circuit device (inter-connector) that connects electronic devices with simple construction and high reliability.

A second object of the present invention is to provide a circuit device (inter-connector) that connect terminals of electronic devices with simple construction and high density.

A third object of the present invention is to provide a circuit device (printed wiring board) that has dense circuit lines and mount electronic devices in a simple process.

A fourth object of the present invention is to provide a fabrication method of a circuit device (printed wiring board) that has dense circuit lines in a simple process.

A fifth object of the present invention is to provide a fabrication method of a printed wiring board that has dense mount electronic devices in a simple process.

A sixth object of the present invention is to provide a fabrication method of a printed wiring board with a high reliability in a simple process.

A seventh object of the present invention is to provide a fabrication method of a printed wiring board with a high quality, a high yield, and a high reliability in a simple process.

An inter-connector as a circuit device according to the present invention, comprising a synthetic resin as a supporting member, reinforced with an insulating cloth or mat, and nearly circular cone shaped conductive bumps pierced vertically into the synthetic resin supporting member and spaced apart from each other, wherein a bottom surface of each of the circular cone shaped conductive bumps is flatly exposed on one main surface of the synthetic resin supporting member and top portions of the circular cone shaped conductive bumps protrude from other surface of the synthetic-resin supporting member.

A printed wiring board as a circuit device according to the present invention comprises a synthetic resin sheet reinforced with an insulating cloth or mat, circular cone shaped conductive bumps pierced vertically into the synthetic resin sheet and spaced apart from each other, and a wiring pattern connected to the exposed edges of the conductive bumps, wherein the bottom surfaces of the conductive bumps are exposed flatly to one main surface of the synthetic resin sheet and the top portions of the conductive bumps are exposed to the other surface of the synthetic resin sheet, the exposed portions connected to a wiring layer (wiring pattern) being deformed.

A fabrication method of a first circuit device according to the present invention comprises the steps of: forming conductive bumps at predetermined positions on at least one main surface of a synthetic resin sheet; and pressuring the main surface of the synthetic resin sheet with the conductive bumps and piercing the conducive bumps vertically into the synthetic resin sheet so as to form through-type conductive lead portions.

A fabrication method of a second circuit device according to the present invention comprises the steps of:

superposing a main surface of a synthetic resin sheet on a main surface of a supporting member with conductive bumps disposed at predetermined positions so as to form a laminate; and pressuring the laminate and piercing the conductive bumps vertically into the synthetic resin sheet so as to form through-type conductive wiring portions.

A fabrication method of a third circuit device according to the present invention comprises the steps of: superposing a main surface of a synthetic resin sheet on a main surface of a conductive metal foil with conductive bumps disposed at predetermined positions so as to form a laminate; pressuring the laminate and piercing the conductive bumps vertically into the synthetic resin sheet so as to form through-type conductive wiring portions; and etching a conductive metal foil of the laminate with the through-type conductive lead portions so as to form a wiring pattern that is connected to the through-type conductive lead portions.

A fabrication method of a fourth circuit device according to the present invention, comprising the steps of superposing a main surface of a synthetic resin sheet on a main surface of a supporting member with conductive bumps disposed at predetermined positions so as to form a laminate, superposing an elastic or flexible member on synthetic resin sheet of the laminate, heating the laminate until a resin component of the synthetic resin sheet is plastic deformed or the temperature of the laminate exceeds a glass transition temperature, pressuring the supporting member as a primary pressuring process so as to pierce top portions of the conductive bumps vertically into the synthetic resin sheet, superposing a conductive metal foil on the synthetic resin sheet where the top portions of the conductive bumps are exposed, pressuring the superposed member as a secondary pressuring process and thereby deforming top portions of the conductive bumps and connecting the top portions to the conductive metal foil so as to form through-type conductive lead portions, and etching the conductive metal foil of the laminate with the through-type conductive wiring portions so as to form a wiring pattern connected to the through-type conductive lead portions.

A fabrication method of a fifth wiring device according to the present invention, comprising the steps of superposing a main surface of a synthetic resin sheet on a main surface of a supporting member with a plurality of conductive bumps disposed at predetermined positions to form a laminate, superposing an elastic or flexible member on the synthetic resin sheet of the laminate, through a thin film with low expanding characteristic and easily breaking characteristic, heating the superposed member until a resin component of the synthetic resin sheet is plastic deformed or the temperature of the laminate exceeds a glass transition temperature, pressuring the supporting member as a primary pressuring process so as to pierce top portions of the conductive bumps vertically into the synthetic resin sheet, superposing a conductive metal foil on the synthetic resin sheet where the top portions of the conductive bumps are exposed, pressuring the superposed member as a secondary pressuring process and thereby deforming top portions of the conductive bumps and connecting the top portions to the conductive metal foil so as to form through-type conductive lead portions, and etching the conductive metal foil of the laminate with the through-type conductive lead portions so as to form a wiring pattern connected to the through-type conductive wiring portions.

A fabrication method of a sixth wiring device according to the present invention, comprising the steps of superposing a main surface of a prepreg sheet having a substrate of cloth whose pitch (a distance between yarns) and a synthetic resin is larger than a diameter of a conductive bump on a main surface of a supporting member with a plurality of conductive bumps disposed at predetermined positions to form a laminate, superposing an elastic or flexible member to be pressurized on the prepreg sheet of the laminate, heating the superposed member until the synthetic resin of the prepreg sheet is deformed or the temperature of the synthetic resin exceeds a glass transition temperature, pressuring the laminate from the supporting member side as a primary pressuring process so as to pierce a plurality of top portions of the conductive lead portions vertically into the prepreg sheet and to expose the plurality top portions thereof, superposing a conductive metal foil on the surface where the plurality of tip portions of the conductive bumps are exposed, pressuring the superposed member as a secondary pressuring process and thereby deforming the top portions of the conductive bumps and connecting the top portions to the conductive metal foil to form through-type conductive wiring portions, and etching the conductive foil of the laminate with the through-type conductive portions so as to form a wiring pattern connected to the through-type conductive wiring portions.

According to the present invention, examples of a supporting member with conductive bumps are a peelable synthetic resin sheet and conductive sheet (foil). According to the present invention, the shape of conductive bumps is not limited to the specific shape. Thus, the top portions of the conductive bumps may be formed in nearly circular cone shape. The supporting member may be a single sheet or patterned. The shape of the supporting member is not limited. In addition, the conductive bumps may be formed over both main surfaces of the supporting member instead of one main surface thereof. The conductive bumps may be formed directly in a protruded state on a main surface of the synthetic resin sheet. Thereafter, the conductive bumps may be pressured so that they are vertically embedded into the synthetic resin sheet.

The nearly circular cylinder shaped conductive bumps and other shaped conductive bumps are preferably made of a material that causes them to be pierced into the synthetic resin sheet in a primary pressuring process where the resin component of the synthetic resin sheet is plastic deformed or the temperature of the synthetic resin sheet exceeds a glass transition temperature and that causes the top portions of the conductive bumps to be plastic deformed in a secondary pressuring process. Examples of this material are conductive compounds and conductive metals such as silver, gold, copper, solder and alloy thereof. The conductive compounds are made by mixing conductive powder of silver, gold, copper, solder, alloy powder thereof, or complex metal powder with a single or complex resin of a binder component such as polycarbonate resin, polysulfone resin, polyester resin, epoxy resin melamine resin, phenoxy resin, phenol resin, and polyimide resin.

The conductive bumps with a high aspect ratio are formed of a conductive compound by printing method using a relative thick metal mask. The height of the conductive bumps are preferably in the range from 50 to 500 $\mu$m. The height of the conductive bumps may be the height to be pierced into one synthetic resin sheet layer and/or two or more synthetic resin sheet layers.

In the case of the nearly circular cone shaped conductive bumps, the height thereof may be in the range from 20 to 500 $\mu$m. When the conductive bumps are pressured and pierced into a synthetic resin sheet reinforced with a glass cloth or mat, an organic synthetic fiber cloth or mat, or a paper, the conductive bumps can thrust such fibers aside. Thus, top portions of the nearly circular cone shaped conductive bumps can be easily exposed on the other main surface of the synthetic resin sheet. Thus, since the conductive bumps thrust the fibers aside, most of the fibers are not broken. Consequently, occurrences of migration can be remarkably prevented. In other words, when the circular cone shaped conductive bumps are used as conductive connecting parts for connecting between wiring layers, since fibers of a reinforcement member contained in the synthetic resin sheet are less broken, occurrence of migration between each conductive connecting parts can be prevented, thereby improving the quality of a resultant printed wiring board. In the case of the nearly circular cone shaped conductor bumps, the top portions of the conductive bumps pierced into the synthetic resin sheet and exposed to the other main surface thereof are sharp. Thus, when a conductive thin film that forms a wiring layer (wiring pattern) is pressed, the top portions of the nearly circular cone shaped conductor bumps are plastic deformed with a high pressure. At this point, active metal surfaces take place both on the nearly circular cone shaped conductor bumps and the pressure receiving surfaces. In other words, metals that do not contain impurities are reliability joined with each other. In addition, since the nearly circular cone shaped conductive bumps are plastic deformed, a thin oxide layer (with a thickness of one micrometer or less) is broken by the top portions of the conductive bumps and thereby new metal surfaces are easily exposed. Thus, the following advantages can be expected. For example, when a copper foil that has been treated with cromate (for anticorrosion), epoxysilane and aminosilane (for improving adhesive or closely contact characteristics to an insulating layer) is used as a conductive thin film that forms a wiring layer, the copper foil provides required electric connections in the conductive connecting portion and contacting and etching characteristics in the wiring region. Thus, the decrease of peel strength can be prevented. The improvements in the peel strength and the migration is especially effective for high-density wiring with finer wiring width.

As a means for forming nearly circular cone shaped conductive bumps with a conductive metal, a gold or copper wire is pushed to a predetermined position on a supporting member such as a copper foil with a tool such as a wire bonder and drawn from the tool. Thus, nearly circular cone shaped conductor bumps with sharp top portions can be formed. As another method, a molten metal is poured to a plate having concaves corresponding to nearly circular cone shaped conductive bumps so as to form the nearly circular cone shaped conductive bumps. As a further means, a photosensitive resist is thickly coated on a supporting sheet. After the supporting sheet is exposed from a supporting sheet side, concaves with sharp top portions is formed. After the supporting sheet is removed, a metal film is superposed on the surface where the supporting sheet was removed. Copper, gold, silver, or solder is plated on the metal film so as to form small nearly circular cone shaped conductive bumps at predetermined positions.

To form conductive bumps with a conductive metal, there are following means. (a) Small metal particles with almost same shape or size are dispersed over a supporting member having an adhesive layer and selectively adhered (with a mask if necessary). (b) When a copper foil is used for a supporting member, a plating resist is printed so as to pattern. Thereafter copper, tin, gold, silver, or solder is plated thereon so as to form small metal columns (bumps). (c) A solder resist is coated on a supporting member so as to pattern it. The coated plate is dipped in a solder bath so as to selectively form small metal columns (bumps). The conductive bumps may be formed of a combination of different metals as a multiple layer construction or multiple shell construction. For example, the conductive bumps may be formed of copper coated with a gold or silver layer so as to provide acid oxidation characteristics. As another construction, the conductive bumps may be formed of copper that is coated with a solder layer so as to provide solder connecting characteristics. According to the present invention, when the nearly circular cone shaped conductive bumps and the other shaped conductive bumps are formed of a conductive compound, the number of fabrication steps is lower than that in plating method or the like. Thus, the present invention is effective in reducing the fabrication cost.

In this example, an example of the synthetic resin sheet into which the nearly circular cone shaped conductor bumps and other shaped conductive bumps pierce and thereby forms through-type conductive portions and conductive wiring portions is a thermoplastic resin film (sheet). The thickness of the synthetic resin sheet is preferably in the range from 50 to 800 $\mu$m. Examples of the thermoplastic resin sheet are vinyl chloride resin, polyester resin, polyether imide resin, polypropylene resin, polyphenylene sulfide resin, polyphenylene oxide resin, polycarbonate resin, polysulfone resin, Thermoplastic polyimide resin, polytetrafluoro-ethylene resin, polyhexafluoropropylene resin, and polyether-etherketone resin, polybutylene terephthalate resin, polyether sulfone resin, and polymetylpentene resin. Examples of thermosetting resin or rubber that is kept in unhardened state before thermosetting are epoxy resin, bis-maleimid-triazine resin, polyimide resin, phenol resin, polyester resin, melamine resin, polyphenylene oxide resin, and butadiene rubber, butyl rubber, natural rubber, chloroprene rubber, and silicone rubber. These synthetic resin sheets may be directly used or contain insulating inorganic or organic filler. In addition, these synthetic resin sheets may be reinforced with a glass cloth or mat, an organic synthetic resin cloth or mat, or a paper.

When a laminate that is made by superposing main surface of a synthetic resin sheet on a main surface of a supporting member with nearly circular cone shaped conductive bumps or other shaped conductive bumps is pressured (as a primary pressuring process), the material of a base plate (supporting member) on which the laminate is placed is preferably a metal plate that is less deformed or a heat resisting resin plate. Examples of the base plate are stainless steel plate, titanium plate, nickel plate, brass plate, polyimide resin plate (sheet), and fluoro resin plate (sheet).

In the primary pressuring process, the laminate is heated while the resin component thereof becomes soft. Thus, the conductive bumps can be properly pierced into the synthetic resin sheet.

When a laminate that is made by superposing main surface of a synthetic resin sheet (including a prepreg sheet) on a main surface of a supporting member with conductive bumps is heated and pressured (as a primary pressuring process), a pressure receiving member should be selected from the materials that are elastically deformed in the primary pressuring process. This is because when the pressure receiving member that is elastically deformed is pressured in the primary pressuring process, the top portions of the conductive bumpers are easily and securely inserted into the synthetic resin sheet whose resin component is plastic deformed or that is heated at a temperature exceeding a glass transition temperature. Further, when a thin film with low expanding characteristics and high breaking characteristics such as an aluminum foil is interposed between the pressure receiving member and the synthetic resin sheet, the top portions of the conductive bumps are more easily and securely pierced into the synthetic resin sheet. These facts were revealed by experiments. The above-mentioned requirements for the pressure receiving substance are also applied to the following construction. In this case, conductive bumps are formed on a main surface of a synthetic resin sheet. The conductive bumps are pushed into the synthetic resin sheet. Thus, required conductive connecting portions are formed.

The primary pressuring process is preferably carried out as follows: a supporting member with conductive bumps and a synthetic resin sheet are drawn from rollers respectively, and they are passed through between a pair of rollers while being subjected to pressure. One of the pair of rollers is preferably made of less deformable and heat-resistant materials such as a metal, a hard heat-resistant resin and a ceramic, and the another is preferably made of deformable material when being subjected to pressure, for example, a rubber, a cloth or a polytetrafluoroethylene resin.

On the other hand, in the secondary pressuring process, the top portions of the conductive bumps that pierced into the synthetic resin sheet are plastic deformed on the conductive metal foil and electrically connected thereto. In the secondary pressuring process, it is not always necessary to heat, but it is allowable to heat as in the primary pressuring process. The conductive metal foil is easily joined and unified into the synthetic resin sheet by the welding and hardening effects of the resin. To plastic-deform the top portions of the conductive bumps pierced into the synthetic resin sheet, pressure applying members made of a metal, a hard and heat resisting resin, or a ceramic is used as a material that is less deformed. In this secondary pressuring process, although a plane press is widely used, a roller system used in the primary kpressuring process may be used.

In the case of the inter-connector as the circuit device according to the present invention, conductive wiring parts that vertically pierce an insulating synthetic resin sheet are formed in nearly circular cone shape. Thus, conductive wiring parts that are fine through-type can be easily and precisely fabricated. In addition, the conductive wiring parts remarkably contribute to improving reliability of electrical connections between both the surfaces. In other words, the conductive wiring parts contribute to size reduction and functional improvement as well as the function of the inter-connector with high reliability.

In the case of the printed wiring board and its fabrication method according to the present invention, in the primary pressuring process, the top portions of the conductive bumps that are precisely and securely pierced into the synthetic resin sheet at predetermined positions while the resin component is plastic deformed or the synthetic resin sheet is heated at a temperature exceeding a glass transition temperature. In the secondary pressuring process, the synthetic resin sheet is plastic deformed and the top portions of the conductive bumps are plastic deformed on the conductive metal foil. Thus, the conductive bumps are securely incorporated into the laminate and the wiring layers are electrically connected with high reliability. In other words, since electrical connections between fine wiring layers can be performed at arbitrary positions with simple process and high reliability, a printed wiring board with high wiring density can be fabricated at low cost. In addition, when the connection between the wiring layers is carried, connecting holes are not necessary, thereby improving density of wiring and devices.

These and other objects, features and advantages of the present invention will become more apparent in light of the following detailed description of a best mode example thereof, as illustrated in the accompanying drawings.

BRIEF DESCRIPTION OF DRAWINGS

FIG. 4A, FIG. 4B, FIG. 4C, and FIG. 4D are side views showing examples of the nearly circular cone shaped conductors that have different shapes, which are principal portions of the inter-connector according to the present invention;

FIG. 5A and FIG. 5B are sectional views schematically showing fabrication steps of a printed wiring board according to the present invention;

DESCRIPTION OF THE PREFERRED EMBODIMENT

Embodiment 1

Figure 1:
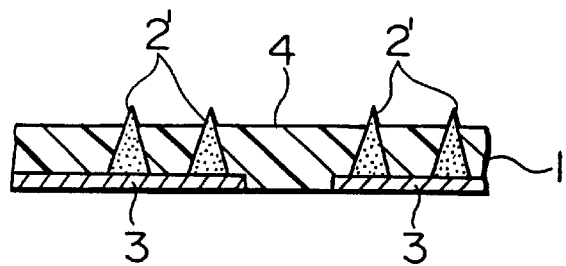
FIG. 1 is a sectional view showing an example of a construction of principal portions of an inter-connector according to the present invention.
Figure 2:
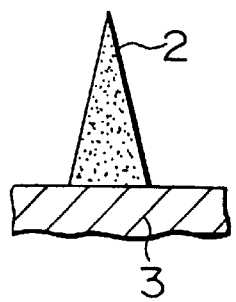
FIG. 2 is a sectional view showing an example of the shape of a nearly circular cone shaped conductor that is a principal portion of the inter-connector according to the present invention.
Figure 3:
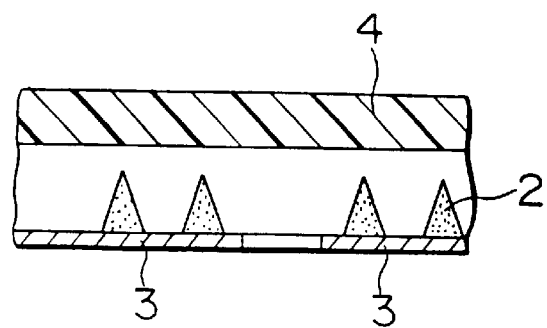
FIG. 3 is a sectional view schematically showing an example of the inter-connector according to the present invention.

FIG. 1 is a sectional view showing principal portions of an embodiment of the construction of an inter-connector according to the present invention. FIGS. 2 and 3 are sectional views schematically showing the inter-connector according to the present invention. In FIG. 1, reference numeral 1 is an inter-connector. Reference numeral 2 is a nearly circular cone shaped conductive wiring part (or inter-connector element). Reference numeral 3 is a copper foil pattern electrically connected and supported to the conductive wiring parts 2. Reference numeral 4 is a synthetic resin sheet into which the nearly circular cone shaped conductive wiring parts 2 are pushed and pierced. Top portions of the nearly circular cone shaped conductive wiring parts 2 are exposed to the front surface of the synthetic resin sheet 4. The top portions being exposed function as connecting terminals.

The inter-connector was fabricated in the following manner. A 35-$\mu$m thick copper foil pattern 3 formed on a supporting sheet (not shown), a silver based conductive paste containing polysulfone resin that serves as a binder (trade name: thermosetting conductive paste DW-250H-5, made by Hokuriku Toryo Co., Ltd.) and a metal mask of a 300 $\mu$m thick stainless steel plate with 0.3-mm diameter holes at predetermined positions were prepared. The metal mask was aligned and placed over the copper foil pattern 3. The conductive paste was printed on the metal mask. After the printed conductive paste was dried, the same conductive paste was printed over the same mask in the same position three times. Thus, nearly circular cone shaped conductive bumps 2 with a height of approximately 200 $\mu$m or less were formed. FIG. 2 shows the shape of the nearly circular cone shaped conductive bump 2 that were formed in such a manner.

Two sheets of 100-$\mu$m thick glass-cloth reinforced epoxy resin prepreg (trade name: TLP-551, made by Toshiba Chemical Co., Ltd.) were prepared as the synthetic resin sheets 4. As shown in FIG. 3, the two synthetic resin sheets 4 were superposed to form a laminate on the copper foil pattern 3 on which the nearly circular cone shaped conductive bumps 2 are formed. A 2-mm thick silicone rubber sheet that serves as a supporting member was superposed on the rear surface of the synthetic resin sheets 4. The resultant laminate was placed between heat press plates heated at a temperature of 120° C. (not shown). After the synthetic resin sheet 4 was plastic deformed, it was pressed at a pressure of 0.3 MPa. The laminate was cooled and then removed from the heat press plates. By peeling off the supporting sheet from the copper pattern 3, the fabrication of the inter-connector 1 as shown in FIG. 1 was completed.

A conductive test for the through-type conductive wiring parts 2 was performed with a circuit tester. The resistance of each conductive wiring parts 2 was 0.01 ohms or less.

In the above-described embodiment, the conductive bumps 2 were in a nearly circular cone shaped. However, the conductive bumps 2 according to the present invention are not limited to such a shape. As shown in FIG. 4A, FIG. 4B, FIG. 4C, and FIG. 4D, the conducive bumps 2 may be formed in a pyramid shape (FIG. 4A), in a circular cone shape with a rounded top portion (FIG. 4B), in a rectangular parallelopiped or circular cylinder shape with a pyramid shaped top portion or circular cone shaped top portion (FIG. 4C), and in a rectangular parallelopiped or circular cylinder shape with a rounded bottom portion (FIG. 4D). Experimental results showed that conductive bumps in various shapes (FIG. 4A to FIG. 4D) had the similar operations and effects as those of the first embodiment.

Embodiment 2

FIG. 5A is a sectional view showing principal portions of an embodiment of the construction of a printed wiring board according to the present invention. FIG. 5B is a sectional view showing an embodiment of the fabrication method of the printed wiring board of FIG. 5A.

As shown in FIG. 5A, the printed wiring board of the Embodiment 2 is a double-sided printed wiring board. In FIG. 5A, reference numeral 4' is a glass-cloth reinforced epoxy resin sheet layer (insulating layer). Reference numerals 3 and 3' are copper patterns formed on both the surfaces of the glass-cloth reinforced epoxy resin sheet layer 4'. Reference numeral 2 is a through-type conductive wiring part that vertically pierces the glass cloth reinforced epoxy resin sheet layer 4', thereby electrically connecting the copper patterns 3 and 3'.

The top portions of the nearly circular cone shaped conductive bumps, which were the through-type conductive wiring parts 2, were deformed by the opposed copper pattern 3' and thereby electrical connections were made. The resistance of the electrical connections by the nearly circular cone shaped conductive bumps was 0.01 ohms or less, which was in a proper level for normal electrical circuits.

Next, an embodiment of the fabrication method of the printed wiring board having the above-mentioned construction will be described.

Circular cone shaped concave portions with a height of 0.3 mm and a bottom diameter of 0.3 mm were formed at predetermined positions of a 2 mm thick aluminum plate. Molten eutectic solder was poured into the circular cone shaped concave portions of the aluminum plate and the solder was squeegeed with a blade so that the solder was deposited only in the circular cone shaped concave portions. While the solder was melted, the same copper pattern as the embodiment 1 was superposed on the solder side. The copper pattern with the nearly circular cone shaped conductor bumps was formed. As with the embodiment 1, two sheets of 100 $\mu$m thick glass-cloth reinforced epoxy resin prepreg (synthetic resin sheets) 4' were superposed together so as to form a laminate. The copper pattern with the nearly circular cone shaped conductor bumps was superposed on the laminate of the two synthetic resin sheets 4'.

As with the embodiment 1, a 2 mm thick silicone rubber sheet that served as a supporting member was layered over the rear surface of the laminate of the synthetic resin sheets. The resultant laminate was placed between heat press plates (not shown) heated at 120° C. When the laminate was plastic deformed, it was pressed with a pressure of 0.3 MPa. After the laminate was cooled, it was removed from the heat press plates. With this process, the nearly circular cone shaped conductor bumps and the copper foil pattern, which supported them, were pushed and pierced into the synthetic resin sheets. Thus, the fabrication of an inter-connector where the top portions of the nearly circular cone shaped conductive bumps were exposed to the front surface of the synthetic resin sheets was completed (as shown in FIG. 1).

As shown in FIG. 5B, a 35 $\mu$m thick copper foil pattern that had been formed on a supporting sheet by etching method was aligned and superposed on the through-type conductive wiring parts 2 with the exposed top portions of the inter-connector 1. The resultant laminate was placed between heat press plates (not shown) heated at 170° C. While the synthetic resin sheets 4' were plastic deformed by heat, it was pressed with a pressure of 1 MPa for one hour. Thereafter, the laminate was cooled and removed from the heat press plates. The supporting sheets, which supported the copper foil patterns 3 and 3', were peeled off. Thus, the fabrication of the printed wiring board shown in FIG. 5A was completed.

A conventional electrical test was performed for double-sided printed wiring boards fabricated in such a method. Test results showed that all the double-sided printed wiring boards did not have defects in connections and reliability.

The region of the conductive connecting portions of the double-sided printed wiring board was vertically cut and observed. Test results showed that the conductive connecting portions 2' pierced between the glass cloth meshes of the synthetic resin sheet 4'. In other words, the conductive connecting portions 2' did not break the glass fibers of the glass-cloth reinforced sheets. Test results showed that the double-sided printed wiring board provided good electrical characteristics without occurrences of migration caused by breakage of glass fibers.

Embodiment 3

Figure 6A:
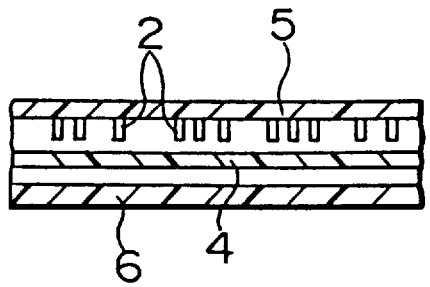
FIG. 6A and FIG. 6B are sectional views schematically showing an example of layers of a synthetic resin sheet and a supporting member with conductive bumps in a primary pressuring process of the fabrication method according to the present invention.
Figure 6B:
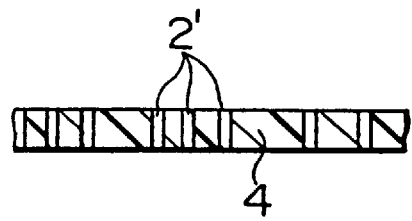

FIG. 6A and FIG. 6B are sectional views schematically showing a third embodiment of the present invention. In this embodiment, a 50 $\mu$m thick polyimide (trade name: Kapton Film made by Toray Industry, Inc.) was prepared as a supporting sheet 5. In addition, a polymer type silver conductive paste (trade name: thermosetting conductive paste DW-250H-5, made by Toyo Spinning Co., Ltd.) and a metal mask made of a 200 $\mu$m thick stainless steel plate with 0.4 mm diameter holes at predetermined positions were prepared.

The metal mask was aligned and placed over the polyimide resin sheet 5 and the conductive paste was printed over the polyimide resin sheet 5 through the metal mask. After the conductive paste was dried, it was printed three times with the same mask at the same position. Thus, mountain shaped conductive bumps 2 with a height of 200 $\mu$m or less were formed. A 100 $\mu$m thick polyether imide resin film (trade name: Sumiraito FS-1400, made by Sumitomo Bakelite Co., Ltd.) was prepared as a synthetic resin sheet 4. As shown in FIG. 6A, the supporting sheet 5 was superposed on the synthetic resin sheet 4 so that the above-mentioned conductive bumps 2 were placed on the synthetic resin sheet 4. A polyimide resin film whose material was the same as the supporting sheet 5 was superposed on the rear surface of the synthetic resin sheet 4. The resultant laminate was pressed with a pressure of 1 MPa. Thereafter, the front and rear sheets 5 and 6 were peeled off. As shown in FIG. 6B, the conductive bumps 2 were pushed into the synthetic resin sheet 4. The top portions of the conductive bumps 2 were deformed by the rear sheet 6. Thus, the fabrication of a printed wiring board with the conductive wiring parts 2', which vertically pierced the synthetic resin sheet 4, was completed.

A conductive test was performed for the through-type conductive wiring parts 2' with a circuit tester. The resistance of all printed wiring board tested was 0.01 ohms or less.

Embodiment 4

Figure 7A:
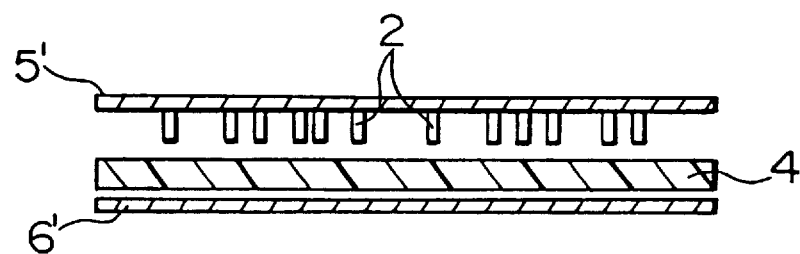
FIG. 7A and FIG. 7B are sectional views showing the shape of the conductive bumps inserted into the synthetic resin sheet by a heat press in the primary pressuring process of the fabrication method of the printed wiring board according to the present invention.
Figure 7B:
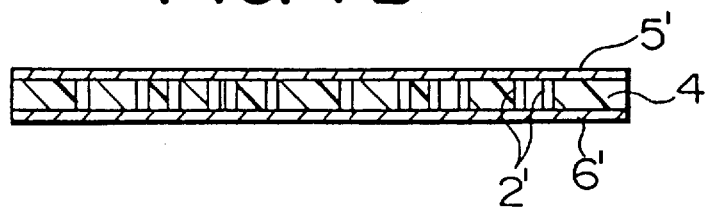

FIG. 7A and FIG. 7B are sectional views schematically showing a fourth embodiment of the present invention. This embodiment is the same as the above-described third embodiment except that a 35 $\mu$m thick electrolytic copper foil 5' was used instead of a polyimide resin film as the supporting sheet 5 and a 35 $\mu$m thick electrolytic copper foil 6' was used as the rear sheet (supporting sheet) 6. The electrolytic copper foils 5' and 6' had been conventionally used for the fabrication of printed wiring boards. As shown in FIG. 7A, the electrolytic copper foil 5' with conductive bumps formed on a main surface thereof, a synthetic resin sheet 4, and the electrolytic copper foil 6' were superposed together so as to form a laminate. The resultant laminate was pressed with a pressure of 1 MPa at 270° C. Thus, as shown in FIG. 7B, the fabrication of a double-sided copper clad substrate with through-type conducting lead portions 2' that connected both the copper foils 5' and 6' was completed. A conventional etching resist ink (trade name: PSR-4000 H, made by TAIYO INK Co., Ltd.) was screen printed on both surfaces of the double-sided copper clad substrate. After the conductive pattern portion was masked, the double-sided copper clad substrate was etched with an etching solution of cupric chloride and the resist mask was peeled off. Thus, the fabrication of a double-sided printed wiring board was completed.

A conventional electric test was performed for double-sided printed wiring boards fabricated in such a method. Test results showed that all the double-sided printed wiring boards did not have defects in connections and reliability.

A double-sided printed wiring board was fabricated in the same conditions as the fourth embodiment except that a zinc-plated copper foil was treated with chromic acid so as to deposit a cromate layer ($3Zn+5CrO_3 \rightarrow 3ZnCrO_4+Cr_2O_3$) and then treated with epoxy silane (or aminosilane). Test results showed that the double-sided printed wiring board had excellent solder resisting characteristics and peel resistance. The conductive pattern was contacted with the synthetic rein sheet 4 through the cromate layer and silane layer (each of which had a thickness of around 0.01 $\mu$m), thereby improving the strength. The top portions of the conducive connecting portions 2' broke the cromate layer, thereby electrically connecting the electrolytic copper foils 5' and 6' with newly exposed surfaces.

Embodiment 5

The fifth embodiment is the same as the Embodiment 3 except that an electrolytic copper foil 5' was used instead of the polyimide resin film as the supporting sheet, a 35 $\mu$m thick electrolytic copper foil 6' was used as the rear sheet (support sheet), and a 200 $\mu$m thick prepreg was used as the synthetic resin sheet 4. The prepreg was formed by coating epoxy resin on a glass cloth. As shown in FIG. 7A, an electrolytic copper foil 5' and the like were layered so as to form a laminate. The laminate was press treated in the following conditions. Thus, the fabrication of a double-sided copper clad substrate with through-type conductive lead portions 2' that connected the copper foils 5' and 6' was completed. In the press process, the laminate was placed between press heat plates and then heated. When the temperature of the laminate became 120° C., it was pressured with a pressure of 2 MPa. In this state, the laminate was further heated until the temperature became 170° C. The laminate was kept at 170° C. for one hour. Thereafter, the laminate was cooled and removed from the heat press plates.

A conventional etching resist ink (trade name: PSR-4000 H, made by TAIYO INK Co., Ltd.) was screen printed on both the surfaces of the double-sided copper foil board so as to mask conductive pattern portions. The conductive pattern portions were etched with an etching solution of cupric chloride. Thereafter, the resist masks were peeled off from the double-sided copper clad substrate. Thus, the fabrication of a double-sided printed wiring board was completed. A conventional electrical test was performed for double-sided printed wiring boards fabricated in such a method. Test results showed that the double-sided printed wiring boards did not have defects in connections and reliability. In addition, to evaluate connections between both conductive patterns, 500 cycles of hot oil test (in each cycle, the double-sided printed wiring board was dipped in oil heated at 260° C. for 10 seconds and then the board was dipped in oil at 20° C. for 20 seconds) were performed. Test results showed that the double-sided printed wiring board did not have defects. Thus, the reliability of connections between the conductive (wiring) pattern layers was much superior to a double-sided printed wiring board fabricated by a conventional copper plating method.

Embodiment 6

Figure 8A:
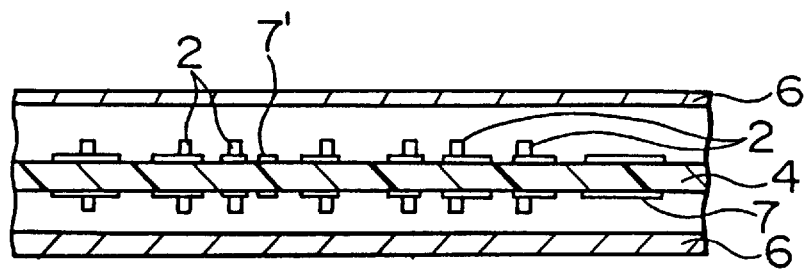
FIG. 8A and FIG. 8B are sectional views showing an example of layers of a synthetic resin sheet and a supporting member with conductive bumps in a secondary pressuring process of the fabrication method according to the present invention.
Figure 8B:

FIG. 8A and FIG. 8B are sectional views schematically showing embodiment 6 of the present invention. In this embodiment, a 120 $\mu$m thick synthetic resin sheet 4 was formed by laminating a PPS resin (trade name: TORERINA 3000, made by Toray Industry, Inc.) on a glass cloth. A conductive paste that was made of silver powder with an average diameter of 1 $\mu$m and polysulfone resin was printed on both main surfaces of the synthetic resin sheet 4 with a stainless screen of 300 meshes. Thus, a required conductive pattern 7 was formed. Thereafter, 0.4 mm square, 80 $\mu$m high conductive bumps 2 were formed at predetermined positions of the conductive pattern 7 with a stainless screen of 180 meshes.

As shown in FIG. 8A, the synthetic resin sheet 4 with conductive bumps 2 that connected layers was sandwiched with polyimide resin sheets 6 that served as supporting members. The resultant laminate was press treated at 295° C. Thereafter, the polyimide resin sheets 6 were peeled off from the laminate. Thus, the fabrication of a double-sided printed wiring board with through-type conductive lead portions 2' that connected the conductive patterns on both the surfaces was completed.

A conventional electric test was performed for double-sided printed wiring boards fabricated in such a method. Test results showed that the double-sided printed wiring boards did not have defects in connections and reliability.

0.4 mm square, 80 $\mu$m high conductive bumps were formed over one or both main surfaces of the synthetic resin sheet 4 with a stainless screen of 180 meshes. The resultant laminate was sandwiched with polyimide resin sheets 6 that served as supporting members. The resultant laminate was press treated at 295° C. Thereafter, the polyimide resin sheets 6 were peeled off from the laminate. Thus, the fabrication of a substrate with conductive lead portions 2' that pierced both the surfaces was completed. Conductive patterns that connected the exposed conductive lead portions 2' were formed on both the main surfaces of the substrate. In other words, a conductive paste made of silver powder with an average particle diameter of 1 $\mu$m and polysulfone resin was printed on both the main surfaces of the substrate with a stainless screen of 300 meshes. Thus, the fabrication of a double-sided printed wiring board was completed. A conventional electric test was performed for double-sided printed wiring boards fabricated in such a method. Test results showed that the double-sided printed wiring boards did not have defects in connections and reliability.

Embodiment 7

Figure 9A:
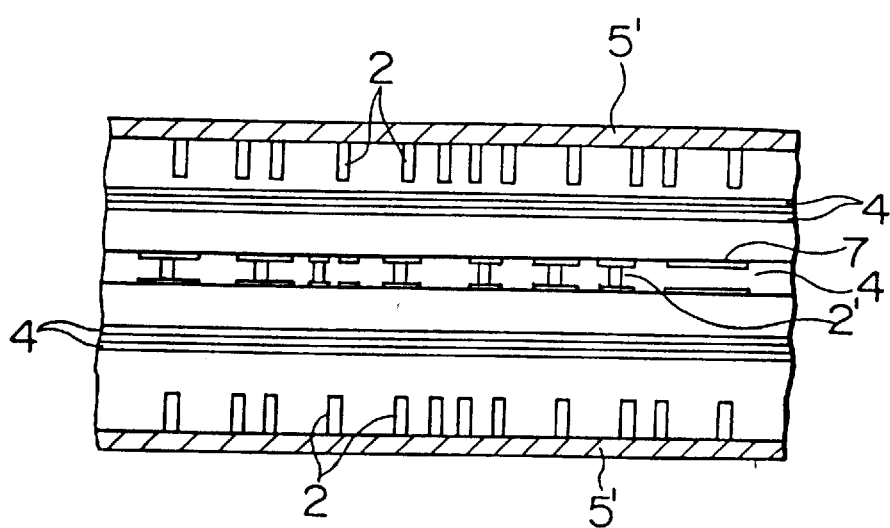
FIG. 9A and FIG. 9B are sectional views showing conductive wiring parts formed of the conductive bumps inserted into the synthetic resin sheet by the heat press in the secondary pressuring process and disposed between copper foils in the fabrication method of the multiple printed wiring board according to the present invention.
Figure 9B:
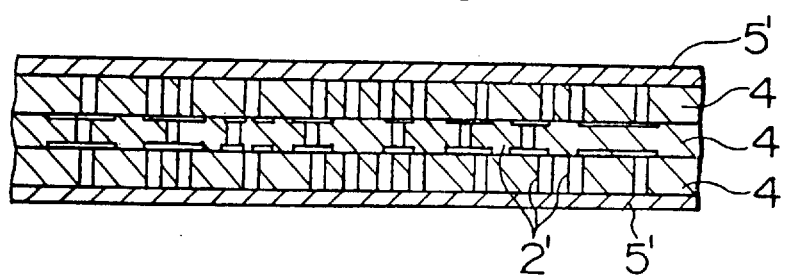

FIG. 9A and FIG. 9B are sectional views schematically showing the embodiment 7 of the present invention. A double-sided wiring board fabricated in the same method as the embodiment 5 was sandwiched with 100 $\mu$m thick glass-cloth reinforced epoxy resin prepreg sheets 4. The resultant laminate was sandwiched with copper foils 5' with conductive bumps 2. The copper foils 5' were the same as those used in the embodiment 5. The resultant laminate was heat-press treated in the same conditions as the embodiment 5. Thus, the fabrication of a four layer copper clad substrate where the inner conductive patterns 7 were connected each other and they were connected to the copper foil 5' on the front surface was fabricated.

A conventional etching resist ink (trade name: PSR- 4000 H, made by TAIYO INK Co., Ltd.) was screen printed on both outer surfaces of the four layer copper clad substrate and conductive pattern portions on both the outer surfaces of the four layer copper clad substrate were masked. The patterns were etched with an etching solution of cupric chloride. Thereafter, the resist masks were peeled off. Thus, the fabrication of a four layer printed wiring board was completed. A conventional electric test was performed for four layer printed wiring boards fabricated in such a method. Test results showed that the four layer printed wiring boards did not have defects in connections and reliability. In addition, to evaluate connections between both the conductive patterns, 500 cycles of hot oil test (in each cycle, the four layer printed wiring board was dipped in oil heated at 260° C. for 10 seconds and then the board was dipped in oil at 20° C. for 20 seconds) were performed. Test results showed that the four layer printed wiring board did not have defects. Thus, the reliability of connections between the conductive (wiring) pattern layers was much superior to a four layer printed wiring board fabricated by a conventional copper plating method.

Embodiment 8

Figure 10A:
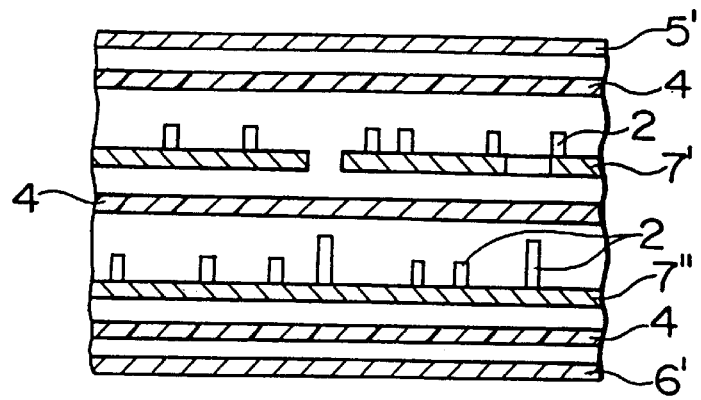
FIG. 10A and FIG. 10B are sectional views schematically showing fabrication steps of a fabrication method of a multiple printed wiring board according to an example of the present invention.
Figure 10B:
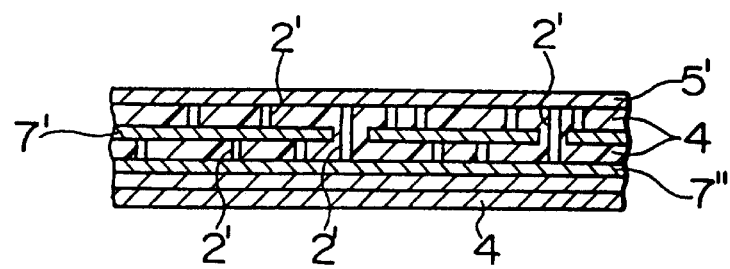

FIG. 10A and FIG. 10B are sectional views schematically showing the embodiment 8 of the present invention.

Copper foils 7' and 7" with conductive bumps 2 formed at least on one surface of a conductive pattern having a predetermined construction (shape) were prepared as supporting sheets. And thereafter the height of the conductive bumps 2 on the copper foil 7" was nearly twice as large as the height of the conductive bumps 2 on the copper foil 7'. In addition, a 100 μm thick prepreg 4 that was the same type as that used in the fifth embodiment, a 35 μm thick electrolytic copper foil 5', and a 35 μm thick electrolytic copper foil 6 that served as a rear sheet (supporting member) were prepared. As shown in FIG. 10A, these materials were layered so as to form a laminate. The resultant laminate was heat-press treated in the same conditions as those of the embodiment 5. As shown in FIG. 10B, the fabrication of a double-sided copper clad substrate where the inner conductive patterns 7' and 7" were connected each other and they were connected to the copper foil 5' on the front surface was completed.

A conventional etching resist ink (trade name: PSR-4000 H, made by TAIYO INK Co., Ltd.) was screen printed on both surfaces of the double-sided copper clad substrate and conductive pattern portions were masked on both the surfaces of the double-sided copper clad substrate. The patterns were etched with an etching solution of cupric chloride. Thereafter, the resist masks were peeled off. Thus, the fabrication of a double-sided printed wiring board was completed. A conventional electric test was performed for double-sided printed wiring boards fabricated in such a method. Test results showed that the double-sided printed wiring boards did not have defects in connections and reliability. In addition, to evaluate connections between both conductive patterns, 500 cycles of hot oil test (in each cycle, the double-sided printed wiring board was dipped in oil heated at 260° C. for 10 seconds and then the board was dipped in oil at 20° C. for 20 seconds) were performed. Test results showed that the double-sided printed wiring board did not have defects. Thus, the reliability of connections between the conductive (wiring) pattern layers was much superior to a double-sided printed wiring board fabricated by a conventional copper plating method.

Embodiment 9

An embodiment 9 according to the present invention is a fabrication method of a printed wiring board. This embodiment is basically the same as the embodiment 4 except for the construction of conductive bumps. Thus, the embodiment 9 will be described with reference to FIG. 7A and FIG. 7B. In this embodiment, a 35 μm thick conventional electrolytic copper foil 5' was used instead of a polyimide resin film as a supporting sheet 5. A plating resist was printed on the rear surface of the copper foil 5' so that exposed regions with a diameter of 0.2 mm were left at predetermined positions. Copper plating process and nickel plating process were performed in this order so as to form a copper layer of approximately 100 μm thick and a nickel layer of approximately 10 μm thick. Thus, conductive bumps with a total of approximately 110 μm were formed. Except that a copper foil 5' with conductive bumps formed by the above-mentioned plating method and a 35 μm thick electrolytic copper foil 6' as a rear sheet (supporting member) 6 were used, in the same method as the embodiment 3, a laminate was formed as shown in FIG. 7A. The laminate was press treated in the same conditions as the third embodiment. Thus, as shown in FIG. 7B, the fabrication of a double-sided copper clad substrate with through-type conductive lead portions 2' that connected the copper foils 5' and 6' was completed.

A conventional etching resist ink (trade name: PSR-4000 H, made by TAIYO INK Co., Ltd.) was screen printed on both the surfaces of the double-sided copper foil board and conductive pattern portions were masked. The board was etched with an etching solution of cupric chloride. Thereafter, the resist masks were peeled off from the double-sided copper clad substrate. Thus, the fabrication of a double-sided printed wiring board was completed. A conventional electrical test was performed for double-sided printed wiring boards fabricated in such a method. Test results showed that the double-sided printed wiring boards did not have defects in connections and reliability. Unlike with the method of this embodiment, when conductive bumps were formed through solder resist masks by a solder dip method, the similar results were obtained. Even if conductive bumps made of conductive compound were formed by the above-mentioned plating method, a printed wiring board with wiring layers that were connected could be fabricated.

Embodiment 10

FIGS. 11, 12, 13, and 14 are sectional views schematically showing an embodiment 10 of the present invention. A 35 μm thick electrolytic copper foil that had been widely used for the fabrication of printed wiring boards was prepared as a supporting sheet. A silver type conductive paste (trade name: UNIMEKKU H9141, made by Hokuriku Toryo Co., Ltd.) with a binder made of polyether sulfone and a metal mask made of a 200 μm thick stainless steel with 0.3 mm diameter holes at predetermined positions were prepared. The metal mask was aligned and placed on the copper foil (supporting sheet) 5' and the conductive paste was printed over the metal mask. After the copper foil was dried, the conductive paste was printed three times with the same mask at the same positions. Thus, circular cone shaped bumps 2 with a thickness of a little under 200 μm or less were formed.

Figure 11:
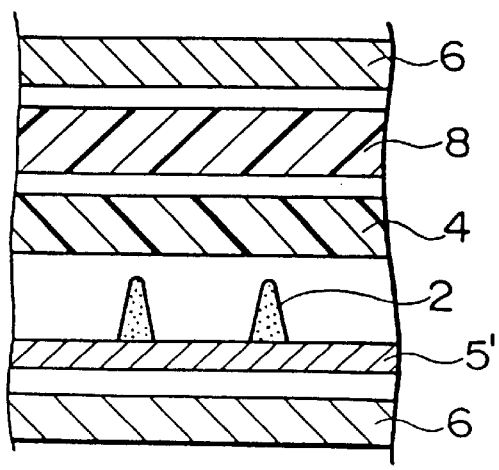
FIG. 11 is a sectional view schematically showing a fabrication step of a fabrication method of a printed wiring board according to an example of the present invention.
Figure 12:
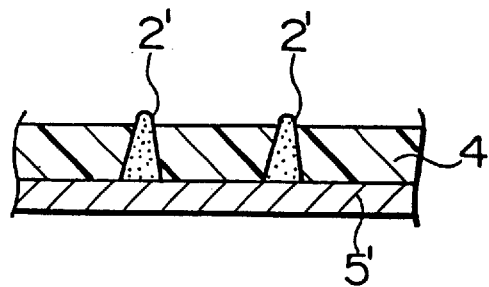
FIG. 12 is a sectional view schematically showing a fabrication step of a fabrication method of a printed wiring board according to an example of the present invention.

A 100 μm thick polyether imide resin film (trade name: Sumiraito FS-1400, made by Sumitomo Bakelite Co., Ltd.) was prepared as a synthetic resin sheet 4. As shown in FIG. 11, the synthetic resin sheet 4 was aligned and superposed on the supporting sheet 5' so that the conductive bumps 2 were placed on the synthetic resin sheet 4. Thereafter, a silicone rubber plate with a thickness of approximately 3 mm that served as a pressure receiving member 8 was placed on the rear surface of the synthetic resin sheet 4 and a supporting member 6 was placed thereon. The resultant laminate was placed in a press unit with heating, pressuring, and cooling mechanisms. The laminate was heated, not pressured. When the temperature of the laminate became 250° C., it was pressured with a primary pressure of 3 MPa (as a primary pressuring process) and cooled. As shown in FIG. 12, with the primary pressure, a laminate with the conductive bumps 2 that precisely pierced the synthetic resin sheet 4 was fabricated.

Figure 13:
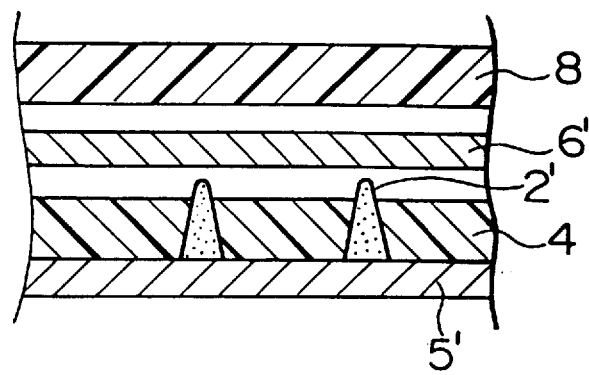
FIG. 13 is a sectional view schematically showing a fabrication step of a fabrication method of a printed wiring board according to an example of the present invention.
Figure 14:
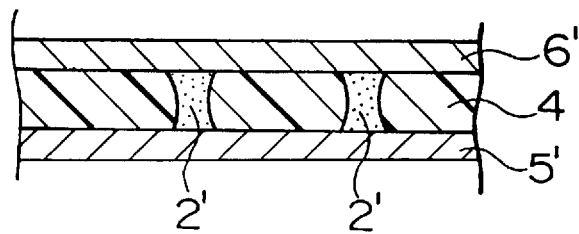
FIG. 14 is a sectional view schematically showing a fabrication step of a fabrication method of a printed wiring board according to an example of the present invention.

Next, as shown in FIG. 13, a 35 μm thick electrolytic copper foil 6' was superposed on the surface into which the top portions of the conductive bumps 2 were pierced. In addition, a polyimide resin film that served as a protecting film (supporting member) 6 was superposed on the copper foil 6'. Thereafter, the resultant laminate was placed between heat press plates heated at 270° C. (not shown). The laminate was pressed with a pressure of 500 kPa. When the temperature of the synthetic resin sheet 4 became 270° C., the laminate was pressed with a pressure of 2 MPa as a secondary pressuring process. While the laminate was pressed with the secondary pressuring process, it was cooled. The laminate 4 was removed from the heat press plates and then the protecting films (sheets) were peeled off. Thus, as shown in FIG. 14, a unified laminate where the copper foil 6' was adhered was fabricated. The top portions of the conductive bumps 2 that pierced the synthetic resin sheet 4 were plastic deformed on the surface of the copper foil 6'. Thus, the conductive bumps 2 were connected to the surface of the copper foil 6'. Consequently, the fabrication of a double-sided copper clad substrate for a printed wiring board with conductive lead portions 2' that vertically pierced the synthetic resin sheet 4 was completed.

A conventional etching resist ink (trade name: PSR-4000 H, made by TAIYO INK Co., Ltd.) was screen printed on both the surfaces of the double-sided copper clad substrate and conductive pattern portions were masked. The board was etched with an etching solution of cupric chloride. Thereafter, the resist masks were peeled off from the double-sided copper clad substrate. Thus, the fabrication of a double-sided printed wiring board was completed. A conventional electrical test was performed for double-sided printed wiring boards fabricated in such a method. Test results showed that the double-sided printed wiring boards did not have defects in connections and reliability.

In this embodiment, when an aluminum foil with a thickness of approximately 15 $\mu$m was placed between the pressure receiving member 8 and the synthetic resin sheet 4 in the primary pressuring process, the conductive bumps 2 securely pierced the synthetic resin sheet 4 with high position accuracy. In addition, the synthetic resin sheet 4 in the vicinity of the conductive connecting portions 2' could be securely prevented from being swelled.

A double-sided printed wiring board was fabricated in the same conditions as the embodiment 4 except that a zinc-plated copper foil was treated with chromic acid so as to deposit a cromate layer ($3Zn+5CrO_3 \rightarrow 3ZnCrO_4+Cr_2O_3$) and then treated with epoxy silane (or aminosilane). Test results showed that this double-sided printed wiring board had excellent solder resisting characteristics and peel resistance. The conductive pattern was contacted with the synthetic resin sheet 4 through the cromate layer and silane layer (each of which had a thickness of around 0.01 $\mu$m), thereby improving the strength. The top portions of the conductive connecting portions 2' broke the cromate layer, thereby electrically connecting the electrolytic copper foils 5' and 6' with newly formed surfaces.

Embodiment 11

Figure 15A:
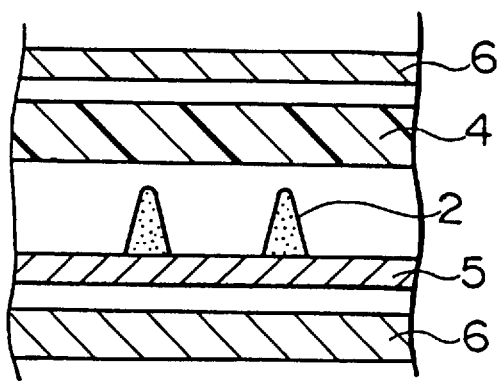
FIG. 15A and FIG. 15B are sectional views schematically showing fabrication steps of a fabrication method of a printed wiring board according to an example of the present invention.
Figure 15B:
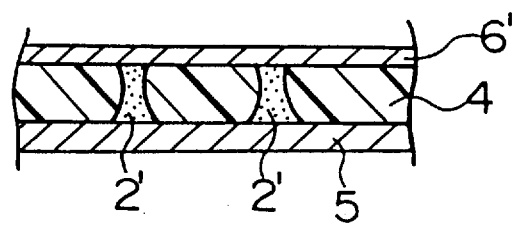

FIG. 15A and FIG. 15B are sectional views schematically showing an embodiment 11 of the present invention. In this embodiment, a single-sided copper clad substrate for a printed wiring board was fabricated in the similar method as the embodiment 10 except that a 50 $\mu$m thick polyimide resin film was used as a supporting sheet 5. In other words, the laminate was press treated with primary pressuring process and secondary pressuring process. As shown in FIG. 15B, the top portions of the conductor bumps 2 were plastic deformed and thereby they were densely connected to the copper foil 6'. Thus, the fabrication of a single-sided copper clad substrate for a printed wiring board with conductive lead portions 2' that vertically pierced the synthetic resin sheet 4 was completed.

A conventional etching resist ink (trade name: PSR-4000 H, made by TAIYO INK Co., Ltd.) was screen printed on the surface of the copper foil 6' of the substrate and a conductive pattern portion was masked. The substrate was etched with an etching solution of cupric chloride. Thereafter, the resist mask was peeled off from the copper clad substrate. Thus, the fabrication of a single-sided printed wiring board was completed. A conventional electrical test was performed for printed wiring boards fabricated in such a method. Test results showed that the printed wiring boards did not have defects in connections and reliability.

The printed wiring board with conductive lead portions 2' that are exposed and pierce the main surface can be used for connection pads, lead terminals, and the like. For example, this printed wiring board is suitable for constructing a rear-surface mounting type circuit devices.

Embodiment 12

An embodiment 12 according to the present invention is the same as the embodiment 10 except that a 200 $\mu$m thick prepreg 4', where epoxy resin was dipped into a glass cloth, was used for a synthetic resin sheet 4. In other words, a laminate used in the embodiment 10 was placed in a press unit (as a primary pressuring process). The laminate was heated until the temperature thereof became 120° C. When the temperature of the laminate became 120° C., it was pressured with a pressure of 2 MPa. Thereafter, the laminate was cooled and removed from the press unit. A copper foil 6' was superposed on the laminate and then placed in the press unit. The laminate was heated and pressured with a pressure of 2 MPa. Thereafter, the temperature of the laminate was kept at 170° C. for one hour. The laminate was cooled and removed from the press unit (as a secondary pressuring process). Thus, the fabrication of a double-side copper clad substrate for a printed wiring board with conductive lead portions 2' that pierced copper foils 5' and 6' was completed.

A conventional etching resist ink (trade name: PSR-4000 H, made by TAIYO INK Co., Ltd.) was screen printed on both surfaces of the double-sided copper clad substrate and conductive pattern portions were masked. The substrate was etched with an etching solution of cupric chloride. Thereafter, the resist masks were peeled off. Thus, the fabrication of a double-sided printed wiring board was complete. A conventional electric test was performed for double-sided printed wiring boards fabricated in such a method. Test results showed that the double-sided printed wiring boards did not have defects in connections and reliability. In addition, to evaluate connections between both conductive patterns, 500 cycles of hot oil test (in each cycle, the double-sided printed wiring board was dipped in oil heated at 260° C. for 10 seconds and then the board was dipped in oil at 20° C. for 20 seconds) were performed. Test results showed that the double-sided printed wiring board did not have defects. Thus, the reliability of connections between the conductive (wiring) pattern layers was much superior to a double-sided printed wiring board fabricated by a conventional copper plating method.

The conductive connecting portion 2' of the double-sided printed wiring board was vertically cut and observed. Test results showed that the conductive connecting portions 2' pierced the glass-cloth meshes of the synthetic resin sheet 4'. In other words, the conductive connecting portions 2' did not break the glass fibers of the glass cloth reinforcement sheets. Test results showed that the double-sided printed wiring board provided good electrical characteristics without occurrence of migration caused by breakage of glass fibers.

Embodiment 13

Figure 16A:
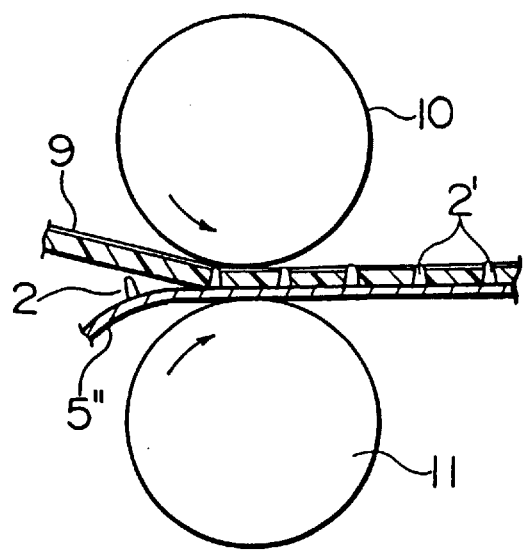
FIG. 16A and FIG. 16B are sectional views schematically showing fabrication steps of a fabrication method of a printed wiring board according to an example of the present invention.
Figure 16B:
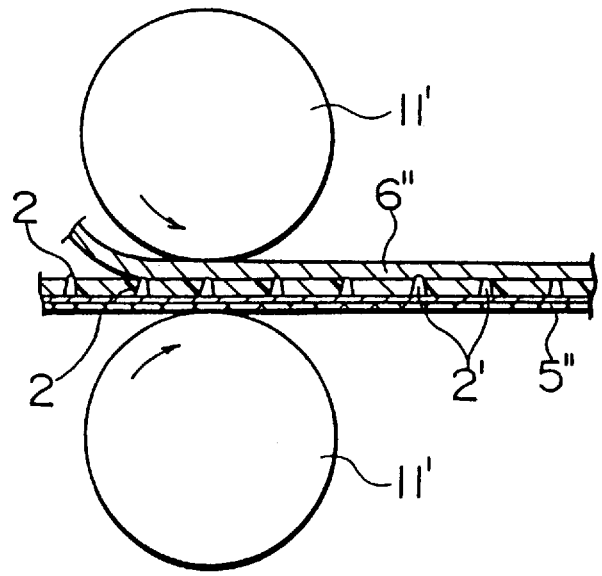

FIG. 16A and FIG. 16B are sectional views schematically showing the embodiment 13 according to the present invention. In this embodiment, a 125 μm thick, 300 mm wide tape shaped synthetic resin sheet 4', where a PPS resin (trade name: TORERINA 3000, made by Toray Industry, Inc.) was laminating on a 0.4 mm pitch glass cloth, was prepared. In addition, a tape 5' with 0.3 mm square, 250 μm long conductive bumps was prepared. The tape 5' was formed by coating a conductive paste made of silver powder with an average particle diameter of 1 μm and polysulfone resin on one main surface of a 125 μm thick, 300 mm wide tape shaped supporting sheet 5" made of an electrolytic copper foil through a metal screen with 0.3 diameter holes defined at predetermined positions. Moreover, a 18 μm thick, 350 mm wide tape shaped electrolytic copper foil 6" and a 15 μm thick, 400 mm wide tape shaped aluminum 9 were prepared. Furthermore, a first two-roll mill and a second two-roll mill were prepared. The first two-roll mill was provided with a rubber roller 10 and a metal roller 11. The rubber roller 10 functioned as a pressure receiving member with a heating source. The metal roller 11 functioned as a pressure applying member. The second two-roll mill was provided with metal rollers 11' having a pair of heat sources. The metal rollers 11' mainly functioned as pressure applying members.

As shown in FIG. 16A, while the tape shaped supporting sheet 5", the tape shaped synthetic resin sheet 4', and the tape shaped aluminum 9 were pulled out from a roller (not shown), they were conveyed and pressured between the rubber roller 10 and the metal roller 11 (heated at 290° C.) of the first two-roll mill. In other words, while the supporting sheet 5", the synthetic resin sheet 4', and the tape shaped aluminum 9, which were layered in this order, were conveyed by the first two-roll mill, they were pressured by the metal roller 11 as a primary pressuring process. Thus, a laminate where the top portions of the bumps 2 on the supporting sheet 5" were pierced into the synthetic resin sheet 4' was fabricated. When the tape shaped aluminum 9 was removed from the laminate and wound around the roller, the fabrication steps that follow become simple.

The laminate was conveyed and pressed by the second two-roll mill as a secondary pressuring process. In other words, the laminate was conveyed between the metal rollers 11' heated at 300° C. in the manner that the tape shaped electrolytic copper foil 6' was superposed on exposed top portions of the bumps 2. When the laminate was conveyed between the metal rollers 11', the synthetic resin sheet 4' was partially softened and thereby unified with the electrolytic copper foil 6". On the other hand, the top portions of the bumps 2, which were pierced and exposed, were plastic deformed and thereby closely connected to the electrolytic copper foil 6". Thus, the fabrication of a substrate for a double-sided printed wiring board with conductive lead portions 2' that pierced and connected the electrolytic copper foils 5" and 6" was completed.

In the same manner as the embodiment 10, the substrate for the double-sided printed wiring board was patterned. Thus, the fabrication of a double-sided printed wiring board was completed. A conventional electric test was performed for double-sided printed wiring boards fabricated in such a method. Test results showed that the double-sided printed wiring boards did not have defects in connections and reliability.

Embodiment 14

Figure 17A:
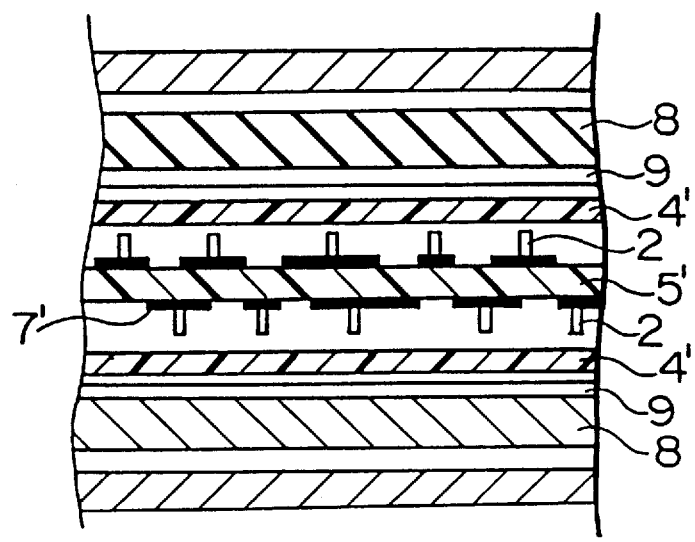
FIG. 17A and FIG. 17B are sectional views schematically showing fabrication steps of a fabrication method of a printed wiring board according to an example of the present invention.
Figure 17B:
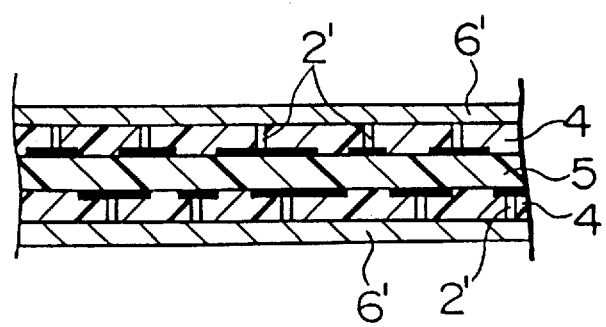

FIG. 17A and FIG. 17B are sectional views schematically showing the embodiment 14 according to the present invention.

Conductive paste type wiring patterns 7' were screen printed on both surfaces of a 100 μm thick glass cloth reinforced epoxy resin sheet 5'. Then, a double-sided wiring type supporting member 5 with 0.3mm diameter 0.3mm high conductive bumps which were disposed at the predetermined positions on the wiring pattern 7' was provided. As shown in FIG. 17A, the supporting member 5 for a double-sided wiring board was interposed between two epoxy resin prepreg sheets 4' reinforced with a 100 μm thick glass cloth so as to form a laminate. Two silicone rubber plates 8 that functioned as pressure receiving members were layered on both the surfaces of the laminate through respective thin aluminum foils 9. While the laminate was heated, it was pressurized as a primary pressuring process. With the primary pressuring process, the top portions of the conductive bumps 2 on the supporting member 5 were pierced vertically into the epoxy resin prepreg sheets 4'.

Electrolytic copper foils 6' and resin films as protecting films were superposed on both surfaces of the laminates where the top portions of the conductive bumps 2 were exposed. The resultant laminate was heat-pressed (as a secondary pressuring process) and then cured. With the secondary pressuring process and the curing process, the layers of the conductor pattern 7', the supporting member 5, and the electrolytic copper foil 6' were adhered together. FIG. 17B is a sectional view showing a four-layer copper clad substrate for a printed wiring board fabricated in such a method. The conductive (wiring) pattern 7' was pierced into the copper foil 6' on the front surface and thereby securely connected thereto.

A conventional etching resist ink was screen printed on both surfaces of the four-layer copper clad substrate and conductive pattern portions were masked. The patterns were etched with an etching solution of cupric chloride. Thereafter, the resist masks were peeled off. Thus, the fabrication of the four-layer printed wiring board was completed. A conventional electric test was performed for printed wiring boards fabricated in such a method. Test results showed that the printed wiring boards did not have defects in connections and reliability. In addition, to evaluate connections between inner conductive patterns and outer conductive patterns, 500 cycles of hot oil test (in each cycle, the printed wiring board was dipped in oil heated at 260° C. for 10 seconds and then the board was dipped in oil at 20° C. for 20 seconds) were performed. Test results showed that the printed wiring board did not have defects. Thus, the reliability of connections between the conductive (wiring) pattern layers was much superior to a printed wiring board fabricated by a conventional copper plating method.

Embodiment 15

Embodiment 15 is a fabrication method of a printed wiring board that is the same as the embodiment 11 except for the construction of conductive bumps. Thus, the embodiment 15 will be described with reference to FIGS. 13 and 14. In this embodiment, a 35 μm thick electrolytic copper foil 5' was used instead of a polyimide resin film as a supporting sheet 5. A plating resist was printed on a rough surface of the copper foil 5'. Thereafter, a layer with 0.3 mm diameter holes disposed at predetermined positions was patterned. Next, a copper plating process and a gold plating process were performed thereon. Thus, a 100 μm high copper layer and a 10 μm high gold layer were formed at the hole regions. As a result, 110 μm high conductive bumps 2 were formed on the copper foil 5' as a supporting sheet 5.

A 100 μm thick polyetherimide resin film (trade name: Sumiraito FS-1400, made by Sumitomo Bakelite Co., Ltd.) was prepared as a synthetic resin sheet 4. The copper foil 5' and a 15 μm thick aluminum foil were superposed on the synthetic resin sheet 4 so that the conductive bumps 2 were placed on the synthetic resin sheet 4. A 3 mm thick silicone rubber plate 8 as a pressure receiving member was layered on the rear surface of the synthetic resin sheet 4. The rear surface of the supporting sheet 5' was pressured with a resin pressure of 3 MPa (as a primary pressuring process) while heating at 260° C. With the primary pressuring process, the top portions of the bumps 2 on the copper foil 5' were precisely pierced into the synthetic resin sheet 4.

As shown in FIG. 13, a 16 μm electrolytic copper foil 6' was layered on the surface on which the top portions of the conductive bumps 2 were exposed. In addition, a polyimide resin film as a protecting film 8 was layered over the copper foil 6'. The resultant laminate was placed between heat press plates heated at 270° C. (not shown). While the synthetic resin sheet 4 was plastic deformed, the laminate was pressurized with a pressure of 2 MPa (as a secondary pressuring process). It was cooled while the laminate was pressed in the secondary pressuring process, and then removed from the heat press plates. The protecting film 8 was peeled off from the laminate. As shown in FIG. 14, the copper foils 5' and 6' were closely adhered unified to and incorporated with the synthetic resin sheet 4. Thus, the fabrication of a double-sided copper clad substrate for a printed wiring board was completed. In this substrate, the top portions of the conductive bumps 2 were pierced into the synthetic resin sheet 4 and plastic deformed on the copper foil 6', thereby forming conductive lead portions 2' that vertically pierced the synthetic resin sheet 4 and connected the copper foils 5' and 6'.

A conventional etching resist ink (trade name: PSR-4000 H, made by TAIYO INK Co., Ltd.) was screen printed on both surfaces of the double-sided copper clad substrate and conductive pattern portions were masked. The patterns were etched with an etching solution of cupric chloride. Thereafter, the resist masks were peeled off. Thus, the fabrication of a double-sided printed wiring board was completed. A conventional electric test was performed for printed wiring boards fabricated in such a method. Test results showed that the resistance of the conductive lead portions was 0.01 ohms or less and the printed wiring boards did not have defects in connections and reliability.

As a modification of this embodiment, circular cone shaped conductive bumps 2 were formed through a solder resist mask by solder dipping method where a supporting substrate was dipped in a solder bath whose temperature was relatively low. Test results of this modification were the similar to those of the embodiment. In addition, when bumps were formed by above-mentioned plating method rather than using conductive compounds described in the above-described embodiments, printed wiring boards with wiring layers connected could be fabricated.

As described above, according to the circuit device of the present invention, conductive lead portions that vertically pierced an insulating supporting substrate were formed of for example circular cone shaped conductive bumps that were pushed and pierced. The circuit device can be easily fabricated. In addition, through-type conductive lead portions can be securely and precisely formed. Moreover, the reliability of electric connections of both surfaces of the substrate can be remarkably improved. In other words, since drilling process, plating process, and the like can be omitted, defects that take place in fabrication steps can be remarkably reduced, thereby increasing the yield of the fabrication. On the other hand, inter-connections and multi-layer printed wiring boards with high reliability can be fabricated. With the inter-connections and multi-layer printed wiring boards, component mounting density and wiring density can be remarkably improved. In addition, component mounting areas can be designated regardless of positions of connecting portions. Thus, the distance between each component can be shortened, thereby improving the reliability of circuits. In other words, the present invention can contribute to not only reducing the cost of inter-connections and wiring boards, but also reducing the size of circuit devices and improving the performance thereof.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A fabrication method of a printed wiring board, comprising the steps of:

forming conductive bumps having a substantially conical shape on at least one main surface of a resin sheet;and pressurizing said conductive bumps vertically into said synthetic resin sheet so as to form conductive lead portions that pierce said synthetic resin sheet.

2. The fabrication method of a printed wiring board, comprising the steps of:

superposing a main surface of a synthetic resin sheet on a main surface of a supporting member with conductive bumps having a substantially conical shape so as to form a laminate; and pressurizing said laminate and piercing said conductive bumps vertically into said synthetic resin sheet so as to form through-type conductive lead portions.

3. The fabrication method as set force in claim 2, wherein said supporting member is a peelable insulating film.

4. The fabrication method as set forth in claim 2, wherein said supporting member is a conductive metal layer.

5. The fabrication method as set forth in claim 2, wherein said supporting member is a conductive metal layer and said main surface of said supporting member is treated with cromate and silane.

6. A fabrication method of a printed wiring board, comprising the steps of:

superposing a main surface of a synthetic resin sheet on a main surface of a conductive metal foil with conductive bumps so as to form a laminate;

pressurizing said laminate and piercing said conductive bumps vertically into said synthetic resin sheet so as to form through-type conductive lead portions; and etching the conductive metal foil of said laminate with said through-type conductive lead portions so as to form a wiring pattern connected to said through-type conductive lead portions.

7. The fabrication method as set forth in claim 6, wherein an inner printed wiring board with at least one wiring pattern surface is intervened in said printed wiring board.

8. The fabrication method as set forth in claim 6, wherein said synthetic resin sheet is a synthetic resin sheet reinforced with an insulating cloth or mat.

9. The fabrication method as set forth in claim 6, wherein said main surface of said conductive metal foil is treated with cromate and silane.

10. The fabrication method as set forth in claim 6, wherein said synthetic resin sheet is a synthetic resin sheet reinforced with an insulating cloth or mat and said conductive bumps pierces fiber meshes of said insulating cloth or mat.

11. A fabrication method of a printed wiring board, comprising the steps of:
    superposing a main surface of a synthetic resin sheet on a main surface of a supporting member with conductive bumps so as to form a laminate;
    superposing a conductive metal foil on said synthetic resin sheet of said laminate so as to form a superposed laminate;
    pressurizing said superposed laminate as a primary pressuring process and thereby piercing said conductive bumps into said synthetic resin sheet, deforming top portions of said conductive bumps and connecting said top portions to said conductive metal foil so as to form through-type conductive lead portions; and
    etching said conductive metal foil so as to form a wiring pattern of said conductive metal foil connected to the through-type conductive lead portions.

12. A fabrication method of a printed wiring board, comprising the steps of:
    superposing a main surface of a synthetic resin sheet on a main surface of a supporting member with conductive bumps so as to form a laminate;
    superposing an elastic or flexible pressure receiving member on said synthetic resin sheet of said laminate to form a superposed laminate, heating said superposed laminate until a resin component of said synthetic resin sheet is plastic deformed or the temperature of said synthetic resin sheet exceeds a glass transition temperature;
    pressurizing said superposed laminate from a supporting member side as a primary pressuring process so as to pierce top portions of said conductive bumps vertically into said synthetic resin sheet and expose said top portions;
    superposing a conductive metal foil on a surface of said synthetic resin sheet where the top portions of said conductive bumps are exposed to form a superposed member;
    pressurizing said superposed member as a secondary pressuring process and thereby deforming top portions of said conductive bumps and connecting said forward edge portions to said conductive metal foil so as to form through-type conductive lead portions; and
    etching said conductive metal foil of said superposed member with said through-type conductive lead portions so as to form a wiring pattern of said conductive metal foil.

13. The fabrication method as set forth in claim 11 or 12, wherein said synthetic resin sheet is a synthetic resin sheet reinforced with an insulating cloth or mat.

14. The fabrication method as set forth in claim 11 or 12, wherein said supporting member is a conductive metal foil.

15. The fabrication method as set forth in claim 11 or 12, wherein said main surface of said conductive metal foil is treated with cromate or silane.

16. The fabrication method as set forth in claim 11 or 12, wherein said synthetic resin sheet is a synthetic resin sheet reinforced with an insulating cloth or mat, said conductive bumps pierces, and fiber meshes of said insulating cloth or mat.

17. A fabrication method of a printed wiring board, comprising the steps of:
    superposing a main surface of a synthetic resin sheet on a main front surface of a supporting member with conductive bumps and a thin film with low expanding characteristic and high breaking characteristic on a main rear surface of a supporting member to form a laminate;
    superposing an elastic or flexible pressure receiving member on a surface of said synthetic resin sheet of said laminate, heating said laminate until a resin component of said synthetic resin sheet is plastic deformed or the temperature of said resin component exceeds a glass transition temperature;
    pressurizing said heated laminate from a supporting member side as a primary pressuring process so as to pierce top portions of said conductive bumps vertically into said synthetic resin sheet;
    superposing a conductive metal foil on a surface of said synthetic resin sheet where the forward edge portions of said conductive bumps are exposed;
    pressurizing said metal foil superposed member as a secondary pressuring process and thereby deforming top portions of said conductive bumps and connecting said top portions to said conductive metal foil so as to form through-type conductive lead portions; and
    etching said conductive metal foil of said metal foil superposed member so as to form a wiring pattern of said conductive metal foil connected to the through-type conductive lead portions.

18. The fabrication method as set forth in claim 17, wherein said synthetic resin sheet is a synthetic resin sheet reinforced with an insulating cloth or mat.

19. The fabrication method as set forth in claim 17, wherein a main surface of said conductive metal foil is treated with cromate and silane.

20. The fabrication method as set forth in claim 17, wherein said synthetic resin sheet is a synthetic resin sheet reinforced with an insulating cloth or mat and forms fiber meshes into which said conductive bumps are pierced.

21. A fabrication method of a printed wiring board, comprising the steps of:
    superposing a main front surface of a prepreg sheet on a main surface of a supporting member with conductive members so as to form a laminate, said prepreg sheet being reinforced with a cloth with pitches larger than the diameter of each of said conductive bump;
    superposing an elastic or flexible pressure receiving member on a main rear surface of said prepreg sheet of said laminate, and heating said laminate until a resin component of said synthetic resin sheet is plastic deformed or the temperature of said resin component exceeds a glass transition temperature;
    pressurizing said superposed and heated supporting member side as a primary pressuring process so as to pierce top portions of said conductive bumps vertically into said prepreg sheet and expose said top portions;
    superposing a conductive metal foil on said prepreg sheet where the top portions of said conductive bumps are exposed;
    pressurizing said metal foil superposed member as a secondary pressuring process and thereby deforming top portions of said conductive bumps and connecting said top portions to said conductive metal foil so as to form through-type conductive lead portions; and
    etching said conductive metal foil of said metal foil superposed member so as to form a wiring pattern of said conductive metal foil connected to the through-type conductive lead portions.

22. The fabrication method as set forth in claim 21,
wherein a main surface of said conductive metal foil is treated with cromate and silane.

23. The fabrication method as set forth in claim 21,
wherein said conductive bumps pierce meshes of a reinforced cloth of said synthetic resin sheet.

* * * * *

UNITED STATES PATENT AND TRADEMARK OFFICE
CERTIFICATE OF CORRECTION

PATENT NO.: 5,822,850

DATED: October 20, 1998

INVENTOR(S): Odaira et al.

It is certified that an error appears in the above-identified patent and that said Letters Patent is hereby corrected as shown below:

Title page, Item [57], in the Abstract, line 10, change "conducive" to --conductive--.

Claim 3, column 22, line 34, change "force" to --forth--.

Claim 10, column 22, line 67, change "pierces" to --pierce--.

Claim 16, column 23, line 62, change "pierces, and" to --pierce--

Signed and Sealed this

Twentieth Day of March, 2001

*Attest:*

NICHOLAS P. GODICI

*Attesting Officer*     *Acting Director of the United States Patent and Trademark Office*